United States Patent [19]
Martin

[11] Patent Number: 5,793,237
[45] Date of Patent: Aug. 11, 1998

[54] CURRENT ONE-SHOT CIRCUIT WITH LINEAR RESPONSE TO AN INPUT SIGNAL TRANSITION

[75] Inventor: Brian C. Martin, Albuquerque, N. Mex.

[73] Assignee: Philips Electronics North America Corporation, New York, N.Y.

[21] Appl. No.: 916,725

[22] Filed: Aug. 18, 1997

Related U.S. Application Data

[63] Continuation of Ser. No. 565,696, Nov. 30, 1995, abandoned.

[51] Int. Cl.$^6$ .................................................. H03K 3/10
[52] U.S. Cl. ........................ 327/227; 327/170; 327/172; 327/108
[58] Field of Search .......................... 327/227, 143, 327/142, 198, 172, 175, 374, 376, 377, 433, 108, 228, 229, 230, 170, 379, 380, 381

[56] References Cited

U.S. PATENT DOCUMENTS

| | | |
|---|---|---|
| 3,711,729 | 1/1973 | Quiogue .................. 327/227 |
| 4,269,496 | 5/1981 | Motoori et al. .......... 327/143 |
| 4,333,047 | 6/1982 | Flink ........................ 327/143 |
| 4,629,908 | 12/1986 | Ethe et al. ................ 327/227 |
| 4,716,310 | 12/1987 | Tanizawa et al. ........ 326/84 |
| 4,808,850 | 2/1989 | Masuda et al. .......... 326/110 |
| 5,243,571 | 9/1993 | Brossard .................. 326/86 |

FOREIGN PATENT DOCUMENTS 57-104317  6/1982  Japan ...................... 327/227

Primary Examiner—Timothy P. Callahan
Assistant Examiner—Terry L. Englund
Attorney, Agent, or Firm—Brian J. Wieghaus

[57] ABSTRACT

A one-shot current circuit generates a current for a desired period during an input signal transition, the desired period during an input signal transition being proportional to the edge rate of the input signal. The circuit includes a MOS transistor device which selectively conducts current between an input terminal and a current generating circuit. The current generating circuit can be a bipolar transistor having its base coupled to the input terminal and a main current path between a circuit output and a supply voltage.

17 Claims, 3 Drawing Sheets

5,793,237

1

CURRENT ONE-SHOT CIRCUIT WITH LINEAR RESPONSE TO AN INPUT SIGNAL TRANSITION

This is a continuation of application Ser. No. 08/565,696, filed Nov. 30, 1995 which is now abandoned.

BACKGROUND OF THE INVENTION

The invention is directed to a current one-shot circuit and more particularly to a BiCMOS current one-shot circuit.

A conventional current one-shot circuit is shown in FIG. 1. Current one-shot circuit 100 includes an input terminal 10, a capacitor C1, a resistor R1, and a bipolar transistor Q1. The collector of transistor Q1 is coupled to a first supply voltage $V_{cc}$ and the emitter of transistor Q1 is coupled to a second supply voltage 14, for example, ground. Resistor R1 is coupled in series with a capacitor C1 between second supply voltage 14 and the base of transistor Q1. Capacitor C1 is coupled between resistor R1 and an input voltage terminal 10. Under static conditions, the base of transistor Q1 is held to ground through resistor R1. However, when an input voltage, $V_{in}$, makes a low-to-high transition, the base voltage of transition Q1 is pulled up through capacitor C1. If $V_{in}$ rises far enough and fast enough so that the base of Q1 is pulled up to about 0.7 volts, transistor Q1 turns on and pulls current through its collector. Transistor Q1 remains on until resistor R1 discharges the base voltage below about 0.7 volts. Accordingly, transistor Q1 provides a current "one-shot" during each low-to-high transition of $V_{in}$.

There are several problems associated with the above current one-shot circuit. First, the RC time constant which controls the duration of the current one-shot is not linear. In fact, the relationship of the current duration to the input voltage is an inverse non-linear relationship whereby a shorter edge rate causes a longer one-shot duration. Also, the RC based current one-shot circuit requires a significant amount of silicon. Accordingly, it is desirable to provide a current one-shot circuit which requires less silicon and varies linearly with the input signal.

SUMMARY OF THE INVENTION

It is an object of the invention to provide a BiCMOS current one-shot circuit. It is another object of the invention to provide a current one-shot circuit which utilizes less silicon than conventional current one-shot circuits.

It is yet a further object of the invention to provide a current one-shot circuit which proportionally tracks the input voltage.

In a preferred embodiment of the invention, a current one-shot is provided which includes an MOS transistor network to selectively provide a current path between the input terminal and the base of a bipolar transistor in order to selectively conduct current through the bipolar transistor.

Still other objects and advantages of the invention will in part be obvious and will in part be apparent from the specification.

The invention accordingly comprises the features of construction, combination of elements, and arrangement of parts which will be exemplified in the construction hereinafter set forth, and the scope of the invention will be indicated in the claims.

BRIEF DESCRIPTION OF THE DRAWINGS

For a fuller understanding of the invention, reference is had to the following description taken in connection with accompanying drawings, in which:

2

Figure 1:
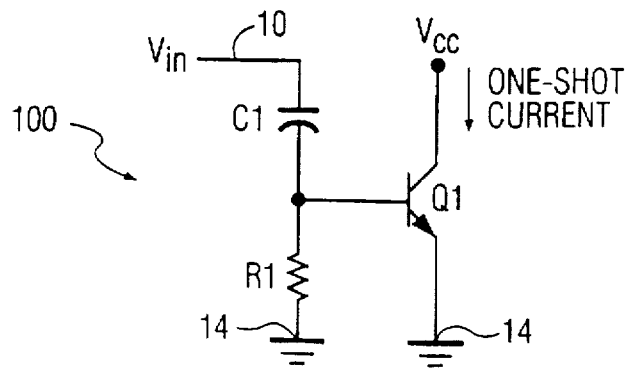
Figure 2:
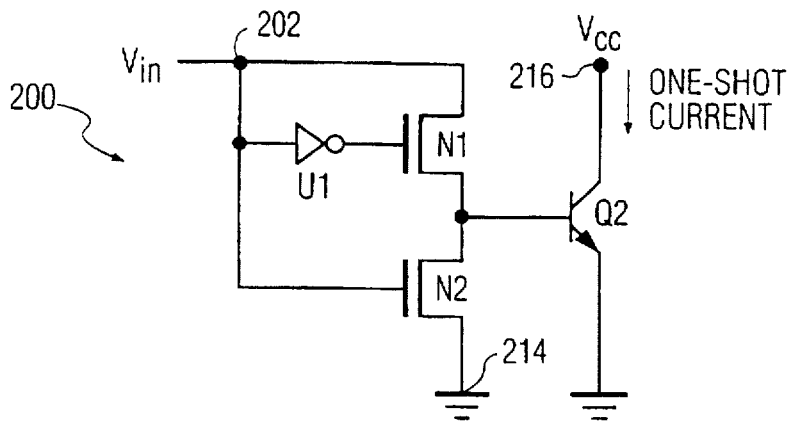
Figure 3:
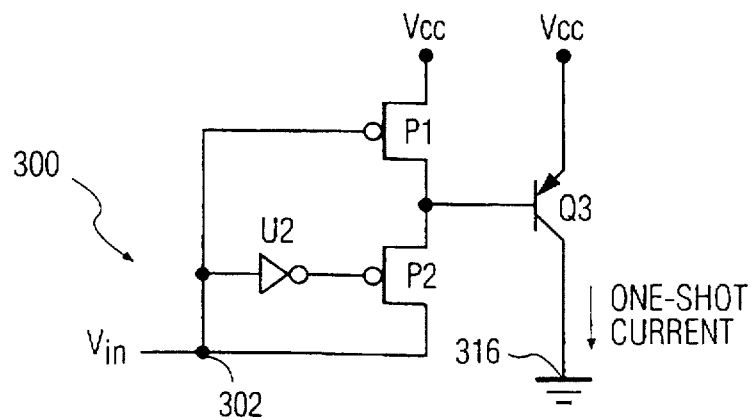
Figure 4:
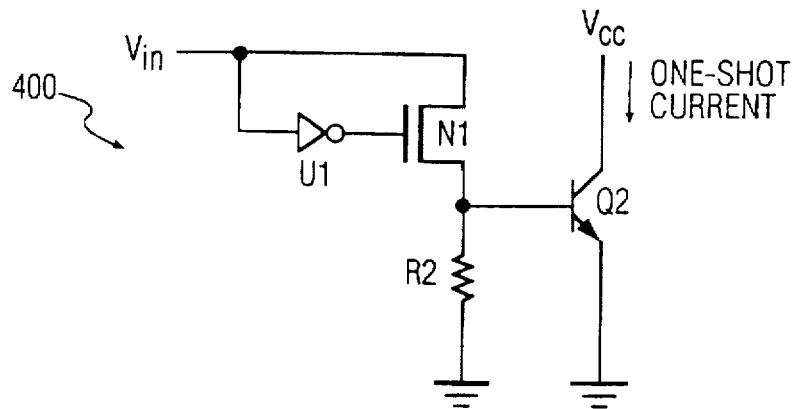
Figure 5:
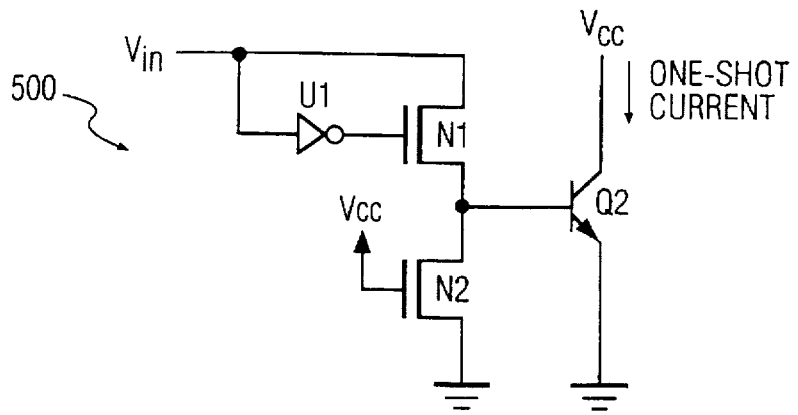
Figure 6:
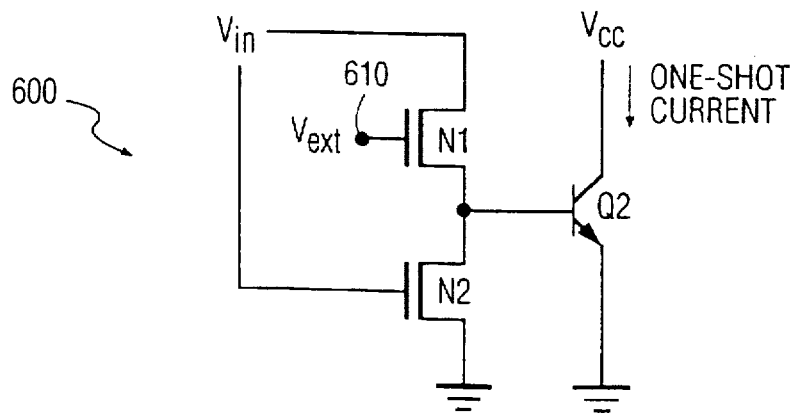
Figure 7:
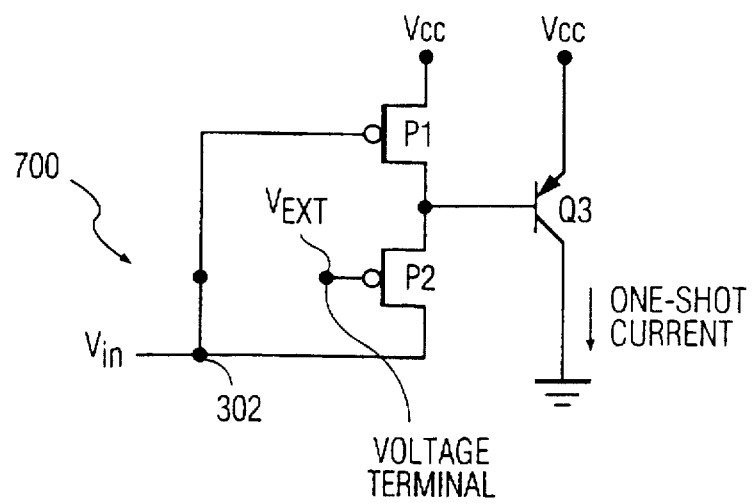

FIG. 1 shows a current one-shot circuit in accordance with the prior art;

FIG. 2 shows a current one-shot circuit in accordance with a first embodiment of the invention;

FIG. 3 shows a current one-shot circuit in accordance with a second embodiment of the invention;

FIG. 4 shows show a current one-shot circuit in accordance with a third embodiment of the invention;

FIG. 5 shows a current one-shot circuit in accordance with a fourth embodiment of the invention;

FIG. 6 shows a current one-shot circuit in accordance with a fifth embodiment of the invention; and FIG. 7 shows a current one-shot circuit in accordance with a sixth embodiment of the invention.

DETAILED DESCRIPTION OF PREFERRED EMBODIMENTS

Reference is had to FIG. 2 which shows a current one-shot circuit 200. One shot circuit 200 includes an input terminal 202, an inverter U1, NMOS transistors N1 and N2 and a bipolar transistor Q2. Input terminal 202 is coupled to an input of inverter U1 and a control electrode of transistor N2. Transistor N1 has a first conducting electrode coupled to input terminal 202, a second conducting electrode coupled to the base of transistor Q2 and a control electrode coupled to an output of inverter U1. Transistor N2 has a first conducting electrode coupled to the base of transistor Q2 and a second conducting electrode coupled to a second supply voltage 214, for example, ground. Transistor Q2 has an emitter coupled to second supply voltage 214 and a collector coupled to an output terminal 216. In a static environment when $V_{in}$ is either high or low, the base of transistor Q2 is discharged to ground or to $V_{in}$ (low) via transistors N2 and N1, respectively. When $V_{in}$ is high, transistor N1 is off, the output of inverter U1 is low and transistor N2 is on. When $V_{in}$ is at a logic low level, transistor N1 is on, the output of inverter U1 is high and transistor N2 is off. When $V_{in}$ undergoes a low-to-high transition, transistor N1 provides a conductive path from input terminal 202 to the base of transistor Q2. When $V_{in}$ equals about 0.7 volts, transistor Q2 begins to turn on and the voltage at the base of transistor Q2 is clamped a diode drop above ground. As $V_{in}$ continues its low-to-high transition, both transistors N1 and N2 (which starts to turn on as soon as $V_{in}$ exceeds the NMOS threshold voltage) conduct more current. The sizing of transistors N1 and N2 is set so that the desired proportion of current enters the base of Q2. In a preferred embodiment, transistor N1 is generally larger than transistor N2.

When $V_{in}$ exceeds the threshold voltage of the inverter U1, the output of inverter U1 goes low, turning transistor N1 off. Transistor N2 then discharges the base of Q2 to ground, turning transistor Q2 off. Thus, during this low-to-high transition, transistor Q2 produces a one-shot current.

Another embodiment of the invention is shown in FIG. 3. Current one-shot circuit 300 operates during the high-to-low transition of $V_{in}$. Current one-shot circuit 300 includes an input terminal 302, PMOS transistors P1 and P2, an inverter U2 and a bipolar transistor Q3. Input terminal 302 is coupled to an input of an inverter U2 and to the control electrode of transistor P1. Transistor P1 has a first conducting electrode coupled to a first supply voltage $V_{cc}$ and a second conducting electrode coupled to the base of transistor Q3. Transistor P2 has a first conducting electrode coupled to the base of transistor Q3, a second conducting electrode coupled to input terminal 302. Transistor Q3 has an emitter coupled to first supply voltage $V_{cc}$ and a collector coupled to an output terminal 316.

In a static environment, when $V_{in}$ is either low or high, the base of transistor Q3 is held to $V_{cc}$ or $V_{in}$ and is off. When $V_{in}$ is high, transistor P1 is off, the output of inverter U2 is low and transistor P2 is on causing the input voltage $V_{in}$ to appear at the base of transistor Q3.

When $V_{in}$ is low, transistor P1 is on, the output of inverter U2 is high and transistor P2 is off, thus causing $V_{cc}$ to appear at the base of transistor Q3.

When $V_{in}$ begins a high-to-low transition, transistor P2 provides a conductive path between the input terminal 302 and the base of transistor Q3. Q3 begins to turn on when $V_{in}=V_{cc}-0.7$, and the voltage at the base of transistor Q3 is clamped to a diode drop below $V_{cc}$. As $V_{in}$ continues its transition, transistors P1 and P2 continue to conduct more current since transistor P1 turns on when $V_{in}$ falls below its threshold voltage.

When $V_{in}$ falls below the threshold of inverter U2, the output of inverter U2 goes high, turning off transistor P2. Transistor P1 turns on, discharging the base of transistor Q3 to $V_{cc}$, turning transistor Q3 off. Thus, during this high-to-low transition, transistor Q3 produces a one-shot current.

Reference is now had to FIG. 4 which shows a current one-shot circuit in accordance with a third embodiment of the invention. Current one-shot circuit 400 is essentially the same circuit as that of FIG. 2 except that a resistor R2 is substituted for transistor N2 to provide the base pull-off of transistor Q3.

Likewise, FIG. 5 shows a current one-shot circuit 500 which is essentially the same circuit as that shown in FIG. 2 except that the control electrode of transistor N2 is coupled directly to first supply voltage $V_{cc}$ to provide the base pull-off of Q3.

Reference is now had to FIG. 6 which shows a current one-shot circuit 600 which is similar to the one-shot circuit shown in FIG. 2 except that the control electrode of transistor N1 is coupled to an external voltage terminal 610 for receiving external voltage signal $V_{ext}$. FIG. 7, similarly, shows a circuit 700 similar to the circuit of FIG. 3 with an external voltage signal $V_{ext}$.

It will thus be seen that the objects set forth above among those made apparent from the preceding description, are efficiently attained and, since certain changes may be made in the above constructions without departing from the spirit and scope of the invention, it is intended that all matter contained in the above description or shown in the accompanying drawings shall be interpreted as illustrative and not in a limiting sense.

It is also understood that the following claims are intended to cover all of the generic and specific features of the invention herein described and all statements of the scope of the invention which, as a matter of language, might be said to fall therebetween.

What is claimed is:

1. A circuit operating between a first supply voltage and a second supply voltage for receiving an input signal and for generating a one-shot current at an output terminal, comprising:

a control circuit having an input terminal for receiving the input signal and for generating a control signal; and means for generating the one-shot current responsive to said control signal for a period of time which is directly proportional to an edge rate of said input signal;

said control circuit and said means for generating being free of an RC network controlling the responsiveness of said one shot current to the edge rate of said input signal.

2. The circuit of claim 1, wherein said period of time varies as a linear function of the edge rate of said input signal.

3. The circuit of claim 1, wherein said means for generating current includes a bipolar transistor having a base coupled to the control circuit and a first conducting electrode coupled to one of said first supply voltage and said second supply voltage.

4. The circuit of claim 3, wherein the control circuit includes an NMOS transistor having a first conducting electrode coupled to the input terminal, a second conducting electrode coupled to the base of the bipolar transistor and a control electrode coupled to a voltage terminal and a resistor coupled between the base of the bipolar transistor and the second supply voltage.

5. The circuit of claim 3, wherein the control circuit includes a first NMOS transistor having a first conducting electrode coupled to the input terminal, a second conducting electrode coupled to the base of the bipolar transistor and a control electrode coupled to a voltage terminal and a second NMOS transistor having a first conducting electrode coupled to the base of the bipolar transistor, a second conducting electrode coupled to the second supply voltage and a control electrode coupled to the first supply voltage.

6. The circuit of claim 3, wherein the control circuit includes a first PMOS transistor having a first conducting electrode coupled to the first supply voltage, a second conducting electrode coupled to the base of the bipolar transistor and a control electrode coupled to the input terminal, a second PMOS transistor having a first conducting electrode coupled to the base of the bipolar transistor, a second conducting electrode coupled to the input terminal and a control electrode coupled to a voltage terminal.

7. The circuit of claim 6, further including an inverter having an input coupled to the input terminal and an output coupled to the voltage terminal.

8. The circuit of claim 3, wherein the control circuit includes a first NMOS transistor having a first conducting electrode coupled to the input terminal, a second conducting electrode coupled to the base of the bipolar transistor and a control electrode coupled to a voltage terminal and a second NMOS transistor having a first conducting electrode coupled to the base of the bipolar transistor, a second conducting electrode coupled to the second supply voltage and a control electrode coupled to the input terminal.

9. The circuit of claim 8, further including an inverter having an input coupled to said input terminal and an output coupled to the voltage terminal.

10. The circuit of claim 8, wherein the voltage terminal receives an external voltage signal for controlling the conduction state of said first NMOS transistor.

11. A circuit operating between a first supply voltage and a second supply voltage for receiving an input signal and for generating a current at an output terminal, comprising:

a control circuit having an input terminal for receiving the input signal and for generating a control signal; and means for generating the current responsive to said control signal for a predetermined period, said predetermined period being directly proportional to an edge rate of said input signal, said means for generating the current including a bipolar transistor having a base coupled to the control circuit and a first conducting electrode coupled to one of said first supply voltage and said second supply voltage; and wherein said control circuit includes (i) a first NMOS transistor having a first conducting electrode coupled to the input terminal, a second conducting electrode coupled to the base of the bipolar transistor and a control electrode coupled to a voltage terminal and (ii) a second NMOS transistor having a first conducting electrode coupled to the base of the bipolar transistor, a second conducting electrode coupled to the second supply voltage and a control electrode coupled to the input terminal.

12. The circuit of claim 11, further including an inverter having an input coupled to said input terminal and an output coupled to the voltage terminal.

13. A circuit operating between a first supply voltage and a second supply voltage for receiving an input signal and for generating a current at an output terminal, comprising:

a control circuit having an input terminal for receiving the input signal and for generating a control signal; and means for generating the current responsive to said control signal for a predetermined period, said predetermined period being directly proportional to an edge rate of said input signal, said means for generating the current including a bipolar transistor having a base coupled to the control circuit and a first conducting electrode coupled to one of said first supply voltage and said second supply voltage; and wherein the control circuit includes (i) an NMOS transistor having a first conducting electrode coupled to the input terminal, a second conducting electrode coupled to the base of the bipolar transistor and a control electrode coupled to a voltage terminal and (ii) a resistor coupled between the base of the bipolar transistor and the second supply voltage.

14. A circuit operating between a first supply voltage and a second supply voltage for receiving an input signal and for generating a current at an output terminal, comprising:

a control circuit having an input terminal for receiving the input signal and for generating a control signal; and means for generating the current responsive to said control signal for a predetermined period, said predetermined period being directly proportional to an edge rate of said input signal, said means for generating the current including a bipolar transistor having a base coupled to the control circuit and a first conducting electrode coupled to one of said first supply voltage and said second supply voltage; and wherein the control circuit includes a (i) first NMOS transistor having a first conducting electrode coupled to the input terminal, a second conducting electrode coupled to the base of the bipolar transistor and a control electrode coupled to a voltage terminal and (ii) a second NMOS transistor having a first conducting electrode coupled to the base of the bipolar transistor, a second conducting electrode coupled to the second supply voltage and a control electrode coupled to the first supply voltage.

15. A circuit operating between a first supply voltage and a second supply voltage for receiving an input signal and for generating a current at an output terminal, comprising:

a control circuit having an input terminal for receiving the input signal and for generating a control signal; and means for generating the current responsive to said control signal for a predetermined period, said predetermined period being directly proportional to an edge rate of said input signal, said means for generating the current including a bipolar transistor having a ba se coupled to the control circuit and a first conducting electrode coupled to one of said first supply voltage and said second supply voltage; and wherein the control circuit includes (i) a first PMOS transistor having a first conducting electrode coupled to the first supply voltage, a second conducting electrode coupled to the base of the bipolar transistor and a control electrode coupled to the input terminal, and (ii) a second PMOS transistor having a first conducting electrode coupled to the base of the bipolar transistor, a second conducting electrode coupled to the input terminal and a control electrode coupled to a voltage terminal.

16. The circuit of claim 15, further including an inverter having an input coupled to the input terminal and an output coupled to the voltage terminal.

17. The circuit of claim 15, wherein the voltage terminal receives an external voltage signal for controlling the conduction state of said second PMOS transistor.

* * * * *